(12) United States Patent
Fan et al.

(10) Patent No.: US 8,658,438 B2
(45) Date of Patent: Feb. 25, 2014

(54) MEASUREMENT OF LATERAL DIFFUSION OF IMPLANTED IONS IN DOPED WELL REGION OF SEMICONDUCTOR DEVICES

(71) Applicant: Shanghai Huali Microelectronics Corporation, Shanghai (CN)

(72) Inventors: Rongwei Fan, Shanghai (CN); Qiliang Ni, Shanghai (CN); Yin Long, Shanghai (CN); Kai Wang, Shanghai (CN); Hunglin Chen, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 0 days.

(21) Appl. No.: 13/721,082

(22) Filed: Dec. 20, 2012

(65) Prior Publication Data
US 2014/0011304 A1    Jan. 9, 2014

(30) Foreign Application Priority Data
Jul. 3, 2012    (CN) .......................... 2012 1 0225784

(51) Int. Cl.
*H01L 21/66* (2006.01)
(52) U.S. Cl.
USPC .................................. 438/17; 438/14; 438/16

(58) Field of Classification Search
USPC ...................................... 438/7, 10, 14, 16, 17
See application file for complete search history.

(56) References Cited

U.S. PATENT DOCUMENTS

| | | | |
|---|---|---|---|
| 3,650,020 A * | 3/1972 | Mar ................................ | 438/18 |
| 6,822,430 B2 * | 11/2004 | Feudel et al. ................. | 324/71.5 |
| 6,878,559 B2 * | 4/2005 | Borden et al. .................. | 438/14 |
| 6,963,393 B2 * | 11/2005 | Borden ....................... | 356/237.4 |

* cited by examiner

*Primary Examiner* — Kevin M Picardat
(74) *Attorney, Agent, or Firm* — Anova Law Group, PLLC

(57) ABSTRACT

The invention provides a measurement of lateral diffusion of implanted ions in the doped well regions of semiconductor devices comprising: designing a test model having active areas, the P-type and N-type doped well regions of the active areas are separated by STI, and the bottom width of the STI is determined; performing multiple processes on the test model comprising the ion implantation process and the tungsten interconnection process to simulate a semiconductor device structure, wherein during the ion implantation process, in the P-type or N-type doped well regions, only the first procedure of the ion implantation process is performed; scanning the test model, obtaining a light-dark pattern of the tungsten interconnects. The present invention is convenient and accessible and can provide reference to optimize the property of the doped well regions of the semiconductor devices and ensure the yield enhancement.

8 Claims, 2 Drawing Sheets

MEASUREMENT OF LATERAL DIFFUSION OF IMPLANTED IONS IN DOPED WELL REGION OF SEMICONDUCTOR DEVICES

CROSS-REFERENCE TO RELATED APPLICATION

This application claims the priority benefit of China application serial no. 201210225784.9, filed Jul. 3, 2012. All disclosure of the China application is incorporated herein by reference.

FIELD OF THE INVENTION

The present invention relates to the field of semiconductor technology, and more particularly to a measurement of lateral diffusion of the implanted ions in the doped well region of the semiconductor devices.

BACKGROUND OF THE INVENTION

The performance of the semiconductor device is significantly affected by the doped well region, it is especially important to control the property of the doped well region as the critical dimension has been reduced to less than 55 nm. The property of the doped well region can be affected by various factors, such as the ion implantation dose, the ion implantation depth, the ion implantation angle, and the ion implantation diffusion, etc. However, due to the lack of the effective evaluation of the ion implantation diffusion, it is difficult to control the effects on the performance of the semiconductor device by the ion implantation diffusion.

In the subsequent thermal annealing process for restoring the crystal lattice, the ions implanted into the doped well region will diffuse, usually lateral diffuse along the damaged crystal lattice. The lateral diffusion may have a greater effect on the performance of the semiconductor device. For example, the ions in the N-type doped well region will diffuse into the P-type doped well region under heating, which may seriously affect the performance of the semiconductor device as the ion diffusion region of the N-type doped well region may cause an electricity leakage in the PMOSFET.

So far the lateral diffusion of the implantation ions of the doped well region is measured via the WAT (wafer acceptance test) and electrical property test. However, since the multiple manufacturing processes performed after the ion implantation diffusion may also affect the measurement results of WAT and electrical property test, the lateral diffusion of the implanted ions of the doped well region is difficult to measure accurately, and the recycle period of the manufacturing processes is extended.

Consequently, an effective measurement of the lateral diffusion of the implanted ions in the doped well region of the semiconductor device is needed.

SUMMARY OF THE INVENTION

Accordingly, at least one object of the present invention is to provide an effective measurement of the lateral diffusion of the implanted ion in the doped well region of the semiconductor device.

To achieve these and other advantages and in accordance with the object of the invention, as embodied and broadly described herein, the invention provides a method of measuring the lateral diffusion of the implanted ions in the doped well region of a semiconductor device comprising:

Step 1, designing a test model having multiple active areas, wherein the active areas comprises P-type doped well regions and N-type doped well regions which are separated by shallow trench isolations, and the bottom width of the shallow trench isolation is determined;

Step 2, performing multiple processes on the test model comprising the ion implantation process and the tungsten interconnection process to simulate a semiconductor device structure in the actual manufacturing process, wherein during the ion implantation process, in the P-type doped well regions or the N-type doped well regions, only the first procedure of the ion implantation process is performed;

Step 3, scanning the test model, obtaining a light-dark pattern of the tungsten interconnects formed above the P-type doped well regions and N-type doped well regions by the tungsten interconnection process.

According to one embodiment of the present invention, the tungsten interconnection process comprises: forming a metal silicide layer; depositing an interlayer dielectric layer; defining tungsten connection holes; filling tungsten in the tungsten connection holes; and performing CMP to remove the tungsten on the surface of the interlayer dielectric layer.

According to one embodiment of the present invention, the multiple processes performed on the test model exclude the process of forming poly-gates and poly-spacers.

According to one embodiment of the present invention, the dimension of the active area is 20 um×50 um.

According to another embodiment of the present invention, the bottom width of the shallow trench isolation is 200 nm-300 nm.

According to another embodiment of the present invention, in the ion implantation process, in the P-type doped well regions, only the first procedure of the ion implantation process is performed; the implanted ions are determined to diffuse into the N-type doped well regions if the tungsten interconnects formed above the P-type doped well regions in the light-dark pattern obtained in the Step 3 are light, while the implanted ion are determined not to diffuse into the N-typed doped well regions if the tungsten connection interconnects formed above the P-type doped well regions are dark.

According to another embodiment of the present invention, in the Step 3, the test model is scanned by an electron-beam inspector.

According to another embodiment of the present invention, the method further comprises: Step 4, obtaining the diffusion ability of the implanted ions according to the bottom width of the shallow trench isolation and the light-dark pattern of the tungsten interconnects.

The present invention provides an accurate measurement of the lateral diffusion of the implanted ions in the doped well regions comprising designing a test model; performing multiple processes comprising the ion implantation process and the tungsten interconnection process to the test model to simulate a semiconductor device structure in the actual manufacturing process; scanning the test model via an electron-beam inspector; and inferring the diffusion ability of the implanted ions according to the test model and the scanning result. Consequently, the present invention can provide reference to the optimization of the doped well regions of the semiconductor devices and ensure the yield enhancement. Furthermore, the present invention is convenient and accessible.

BRIEF DESCRIPTION OF THE DRAWINGS

The method of measuring the lateral diffusion of the implanted ions in the doped well regions of the semiconductor device in accordance with the present invention will be elucidated by reference to the following embodiments and the accompanying drawings, in which.

DETAILED DESCRIPTION OF THE EMBODIMENTS

The measurement of the lateral diffusion of the implanted ions in the doped well regions of semiconductor devices of the present invention will be described in further details hereinafter with respect to the embodiments and the accompanying drawings.

Figure 1:
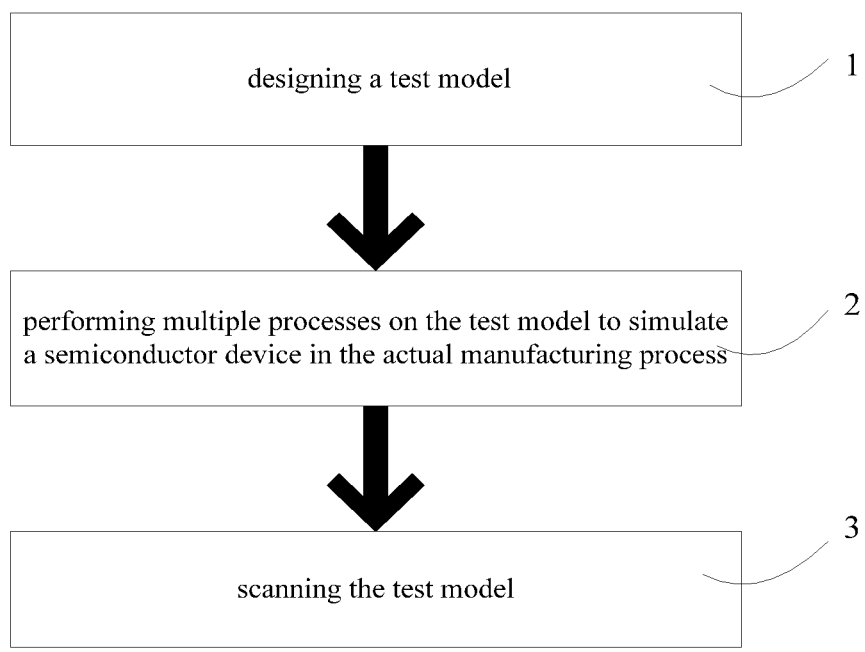
FIG. 1 is a flow chart of the method of measuring the lateral diffusion of the implanted ion in the doped well regions of the semiconductor device in an embodiment of the present invention.

Referring to FIG. 1, the method of measuring the lateral diffusion of the implanted ions in the doped well region of the semiconductor device comprises the following steps:

Step 1, designing a test model. The test model is divided into different groups of active areas (AA) with a certain area, such as 20 um×50 um. In these active areas, N-type doped well regions and P-type doped well regions are formed with spacing, and the N-type doped well region and the P-type doped well region are separated by STI (shallow trench isolation). The critical dimensions of the bottom width of the STI are determined differently according to the actual manufacturing process. For example, if the bottom width of the STI is presumed to be 250 nm in the actual manufacturing process, the critical dimension of the bottom width of the STI can be determined in the range from 200 nm to 300 nm. The test model can be placed on the wafer as needed. For different test model measurements, the condition of the ion implantation in the doped well region can be changed on the premise that the other conditions are determined.

Step 2, performing multiple processes on the test model to simulate a semiconductor device structure in the actual manufacturing process. The multiple processes comprise the ion implantation process and the tungsten interconnection process. As for the ion implantation process, the ion implantation conditions in the doped well regions are adjusted as needed. For example, in the measurement of the lateral diffusion of the implanted ions in the P-type doped well region, only the first procedure of the ion implantation process is performed in the P-type doped well region while normal ion implantation process is performed in the N-type doped well region. As for the tungsten interconnection process, it comprises the steps of forming a metal silicide layer, depositing an interlayer dielectric layer, defining tungsten connection holes, filling tungsten in the tungsten connection holes and performing CMP to remove the tungsten on the surface of the interlayer dielectric layer. As a result, the tungsten interconnects are formed. Note that, in a preferred embodiment, the test model is simplified. In an embodiment, the test model is designed to simulate a SRAM, and is simplified to omit the poly-gates and the poly-spacers, so as to eliminate other factors which may affect the measurements. Therefore, during the multiple processes performed on the test model, the process of forming poly-gates and poly-spacers is excluded.

Figure 2A:
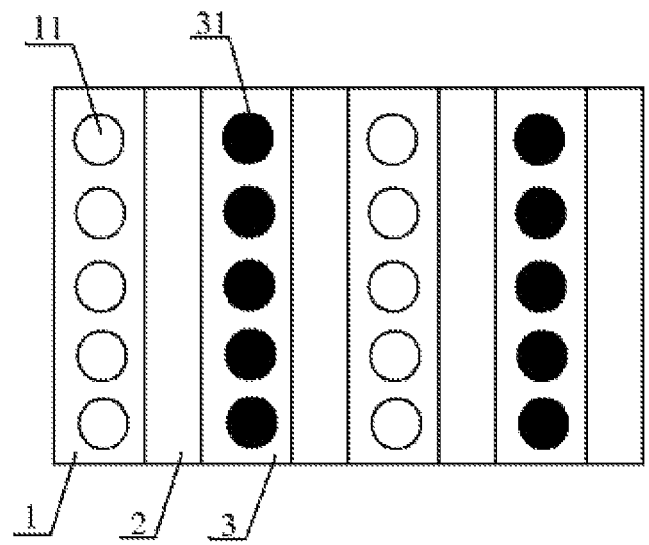
FIG. 2a is a schematic diagram of the light-dark pattern of the tungsten interconnects unaffected by the diffusion of the implanted ions in the N-type doped well regions.
Figure 2B:
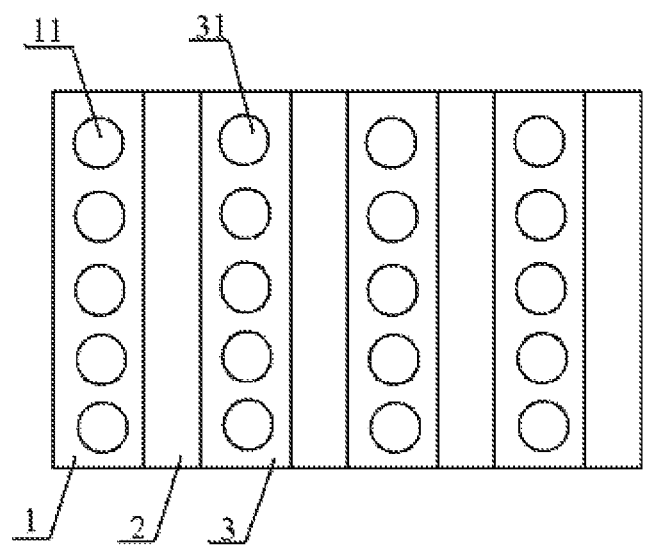
FIG. 2b is a schematic diagram of the light-dark pattern of the tungsten interconnects affected by the diffusion of the implanted ions in the N-type doped well regions.

Step 3, scanning the test model using an electron-beam inspector. After the tungsten interconnects are formed, the E-beam (electron-beam) inspector is used to scan the test model. Referring to FIGS. 2a and 2b, wherein the numeral 1 represents the N-type doped well region, the numeral 11 represents the tungsten interconnects in the N-type doped well regions, the numeral 2 represents the shallow trench isolations, the numeral 3 represents the P-type doped well regions, the numeral 31 represents the tungsten interconnects in the P-type doped well regions. Normally, referring to FIG. 2a, the tungsten interconnects 31 formed above the P-type doped well regions are dark when the E-beam is applied in a positive mode, while the tungsten interconnects 11 formed above the N-type doped well regions are light. If the ions in the P-type doped well regions diffuse into the N-type doped well regions, as shown in FIG. 2b, the tungsten interconnects 31 formed above the P-type doped well regions become light due to the electricity leakage.

Finally, according to the change of the light and darkness aforementioned and the bottom width of the STI determined in the Step 1, the lateral diffusion ability of the implanted ions in the P-type doped well region can be inferred.

In summary, the measuring method in the embodiment of the present invention comprises designing a test model, performing multiple processes comprising the ion implantation process and the tungsten interconnection process to the test model to simulate a semiconductor device structure in the actual manufacturing process; scanning the test model via an electron-beam inspector, and inferring the diffusion ability of the ions according to the test model and the scanning result. Consequently, the present invention provides reference to optimize the doped well region of the semiconductor device, ensures the yield enhancement, and is convenient and accessible.

The present invention can be applied in the monitor of the ion implantation conditions in the doped well region, so as to optimize the property of the semiconductor device and obtain whether the leakage problem is effectively solved.

Although the present invention has been disclosed as above with respect to the preferred embodiments, they should not be construed as limitations to the present invention. Various modifications and variations can be made by the ordinary skilled in the art without departing the spirit and scope of the present invention. Therefore, the protection scope of the present invention should be defined by the appended claims.

The invention claimed is:

1. A method of measuring the lateral diffusion of implanted ions in the doped well region of semiconductor devices comprising:

Step 1 , designing a test model having multiple active areas, wherein the active areas comprises P-type doped well regions and N-type doped well regions which are separated by shallow trench isolations, and the bottom width of the shallow trench isolation is determined;

Step 2 , performing multiple processes on the test model comprising the ion implantation process and the tungsten interconnection process to simulate a semiconductor device structure in the actual manufacturing process, wherein during the ion implantation process, in the P-type doped well regions or the N-type doped well regions, only the first procedure of the ion implantation process is performed;

Step 3 , scanning the test model, obtaining a light-dark pattern of the tungsten interconnects formed above the P-type doped well regions and N-type doped well regions by the tungsten interconnection process.

2. The method according to claim 1, wherein the tungsten interconnection process comprises: forming a metal silicide layer; depositing an interlayer dielectric layer; defining tungsten connection holes; filling tungsten in the tungsten connection holes; and performing CMP to remove the tungsten on the surface of the interlayer dielectric layer.

3. The method according to claim 1, wherein the multiple processes performed on the test model exclude the process of forming poly-gates and poly-spacers.

4. The method according to claim 1, the dimension of the active area is 20 um×50 um.

5. The method according to claim 1, wherein the bottom width of the shallow trench isolation is 200 nm~300 nm.

6. The method according to claim 1, wherein in the ion implantation process, in the P-type doped well region, only the first procedure of the ion implantation process is performed; the implanted ions are determined to diffuse into the N-type doped well region if the tungsten interconnects formed above the P-type doped well regions in the light-dark pattern obtained in the Step 3 are light, while the implanted ion are determined not to diffuse into the N-typed doped well region if the tungsten interconnects formed above the P-type doped well regions are dark.

7. The method according to claim 1, in the step 3, the test model is scanned by an electron-beam inspector.

8. The method according to claim 1, further comprising: Step 4, obtaining the diffusion ability of the implanted ions according to the bottom width of the shallow trench isolation and the light-dark pattern of the tungsten interconnects.

* * * * *